United States Patent [19]
Watanabe et al.
[11] 4,136,611
[45] Jan. 30, 1979

[54] ELECTROSTATIC PRINTING DIRECTLY ONTO PAPER

[75] Inventors: Akinori Watanabe; Akio Nagano; Katsuhide Tanoshima, all of Tokyo, Japan

[73] Assignee: Oki Electric Industry Co., Ltd., Tokyo, Japan

[21] Appl. No.: 809,055

[22] Filed: Jun. 22, 1977

[30] Foreign Application Priority Data

Jun. 25, 1976 [JP] Japan .................................. 51/74405

[51] Int. Cl.[2] .......................... G03F 7/16; G03G 5/10; G03G 15/12; G03G 15/22

[52] U.S. Cl. .......................................... 101/1; 34/115; 101/DIG. 13; 219/216; 219/469; 219/546

[58] Field of Search ........................... 101/DIG. 13, 1; 219/216, 469, 546; 34/115

[56] References Cited

U.S. PATENT DOCUMENTS

| | | | |
|---|---|---|---|
| 995,721 | 6/1911 | Rice | 34/115 |
| 2,691,345 | 10/1954 | Huebner | 101/D 13 |
| 2,716,048 | 8/1955 | Young | 101/D 13 |
| 2,726,166 | 12/1955 | Greaves | 101/D 13 |
| 2,817,765 | 12/1957 | Hayford et al. | 101/D 13 |
| 2,832,311 | 4/1958 | Byrne | 101/D 13 |
| 3,160,091 | 12/1964 | Schwertz | 101/D 13 |
| 3,752,288 | 8/1973 | Detig et al. | 101/D 13 |
| 3,771,634 | 11/1973 | Lamb | 101/D 13 |
| 3,806,355 | 4/1974 | Kaufman | 101/D 13 |

FOREIGN PATENT DOCUMENTS

| | | | |
|---|---|---|---|
| 1408505 | 10/1975 | United Kingdom | 101/D 13 |

*Primary Examiner*—Clyde I. Coughenour
*Attorney, Agent, or Firm*—Peter L. Berger

[57] ABSTRACT

This invention provides for an improved high speed printer using electrostatic means. The paper used is ordinary paper that is first dried to increase its electrical resistance. The electrostatic image is produced directly on the ordinary paper and then the electrostatic image is developed and fixed thereon. The invention includes details of the heating means.

4 Claims, 6 Drawing Figures

ELECTROSTATIC PRINTING DIRECTLY ONTO PAPER

BACKGROUND OF THE INVENTION

This invention relates to a high speed printer using an electrostatic image.

Speed-up of the central processors of electronic computer systems is necessitating corresponding speed-up of the printers which are output terminal units of such computer systems. There are various types of printers put in use. One of them transfers and fixes the electrostatic image to the printing paper by developing and visualising the electrostatic image with coloured loaded grains, forming in advance the electrostatic image on the sensitive plate which forms photoconductive substance layer on the supporting member, or developes and fixes it after transfering the aforesaid electrostatic image on the printing paper.

Relating to this case there are U.S. Pat. No. 3,673,598 as a method of forming the electrostatic image and U.S. Pat. No. 3,220,933 is proposed as developer and fixing apparatus.

Both of the above-mentioned methods have a drawback of the trouble in maintenance because of using the sensitive plate which is easily damaged and deteriorated.

SUMMARY OF THE INVENTION

This invention provides an improved high speed printer which is so constructed that a desired electrostatic image is formed by having loaded grains adhered selectively on the printing paper of ordinary paper, directly after drying it in advance to increase the electric resistance thereof, requiring neither sensitive plate nor speciality printing paper.

OBJECTS OF THE INVENTION

The first object of this invention is to increase the resistance of the printing paper by drying it in advance of printing.

The second object of this invention is to form a desired electrostatic image directly by using printing paper made of ordinary paper.

The third object of this invention is to dry the printing paper by the heating member mounted around the circumference of the heating drum.

The fourth object of this invention is to dry the printing paper by feeding it closely adhered to the circumference of the heating drum by rotating the heating drum equipped with the heating member all over the circumference thereof.

The fifth object of this invention is to dry the printing paper from the aperture openings around the circumference of the heating drum with the aid of the hot air blown therethrough.

DETAILED DESCRIPTION OF THE INVENTION

Figure 1:
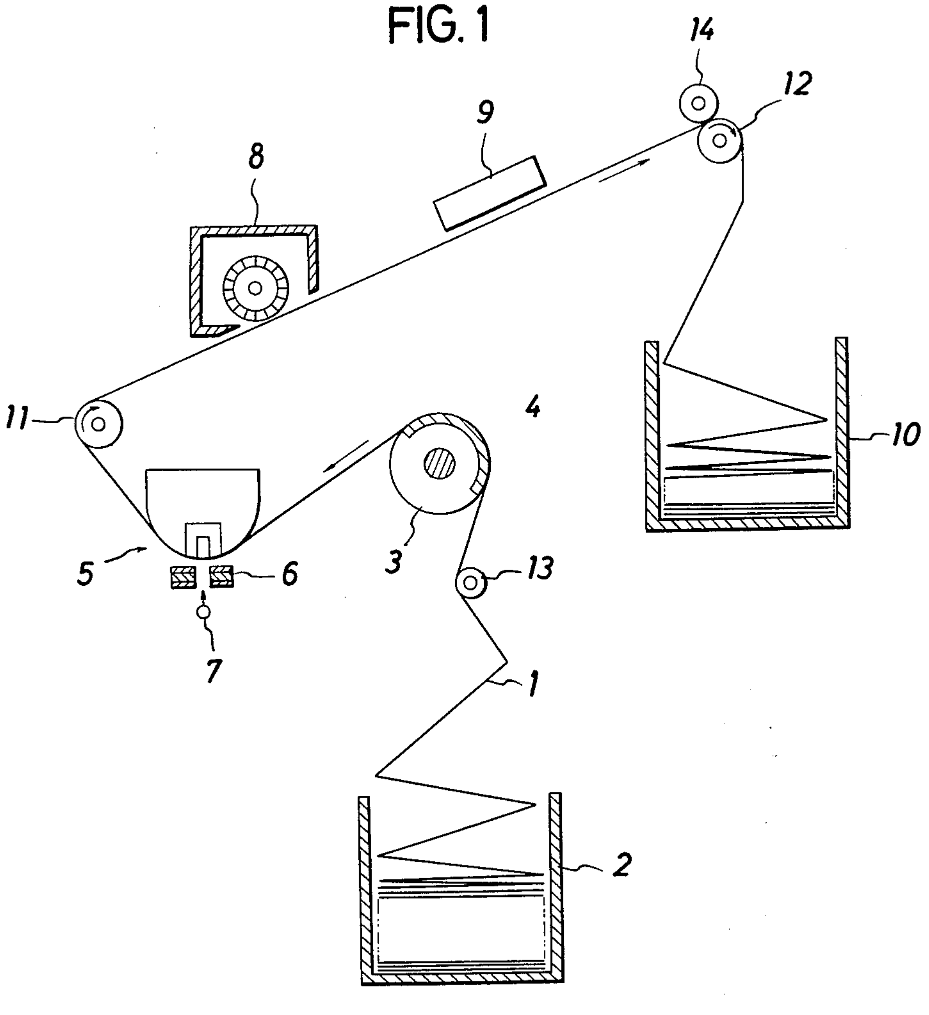
FIG. 1 is an illustrative assembly drawing showing an embodiment of this invention.

Referring first to FIG. 1, numeral 1 is a printing paper made of ordinary paper, numeral 2 is a hopper to store the printing paper 1, numeral 3 is a heating drum for drying the printing paper by the heating plate 4, numeral 5 is an electrostatic image former to form the desired characters, symbols, numerals, etc, on the relative printing paper 1 by adhering the loaded grains 7 selectively controlled by the aperture board 6 to the above-mentioned printing paper. The numeral 8 is a developer which forms the electrostatic image formed on the printing paper into a visible dust figure by developing it by the thermo-softened loaded coloured grains, numeral 9 is a fixing apparatus for fixing the visible grain image formed by the developer 8 by thermo-fusing. Numeral 10 is a stacker which temporarily stores the printed paper. Numeral 11 and 12 indicate driving rollers and numerals 13, 14 indicates guide rollers.

Figure 2:
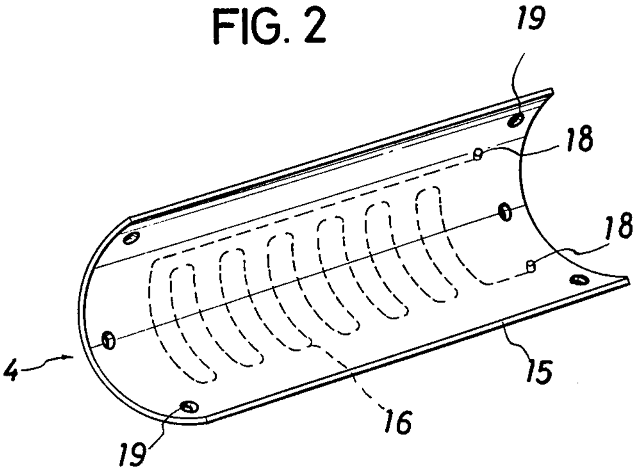
FIG. 2 is a perspective view of the heating plate.
Figure 3:
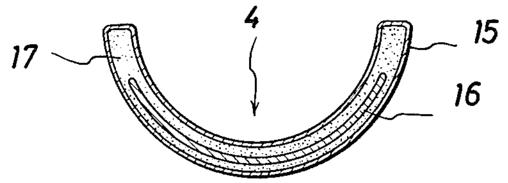
FIG. 3 is a cross-sectional view of the heating plate enlarged in the thickness direction.
Figure 4:
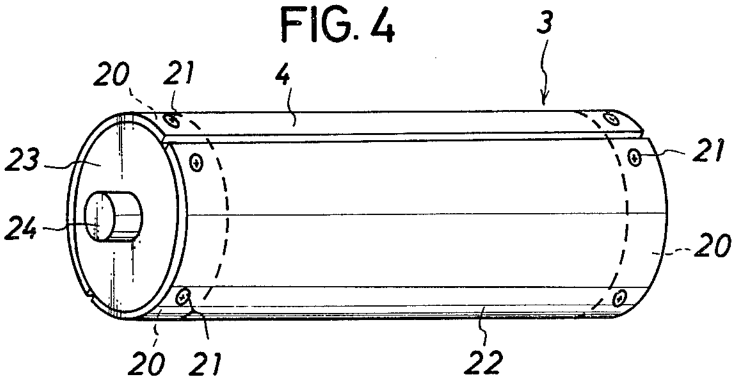
FIG. 4 is a perspective view of the heating drum equipped with the heating plate around the part of the circumference thereof.

An embodiment of the heating plate 4 of the above-mentioned heated drum is shown in FIG. 2 and FIG. 3 and the heater 16 of Ni-Cr wire is bent and put into the semi-cylindrical external cover suitable for the heating drum by holding it in mica 17. Numeral 18 is a terminal and, numeral 19 is a fixing aperture. The heating drum 3 is constructed by fitting the heating plate 4 over the half of the circumference of the brass made flange 20 by fitting a setscrew in the fixing aperture and the remaining part of the circumference is fitted with the brass made non-heating part 22 as shown in FIG. 1 & 4. The printing paper 1 is so positioned as to contact the surface of the heating plate 4 at the time of printing because the said heating drum 3 is fixed to the frame body by the supporting shaft (not shown) which projects to the brass made side plate 23.

Figure 5:
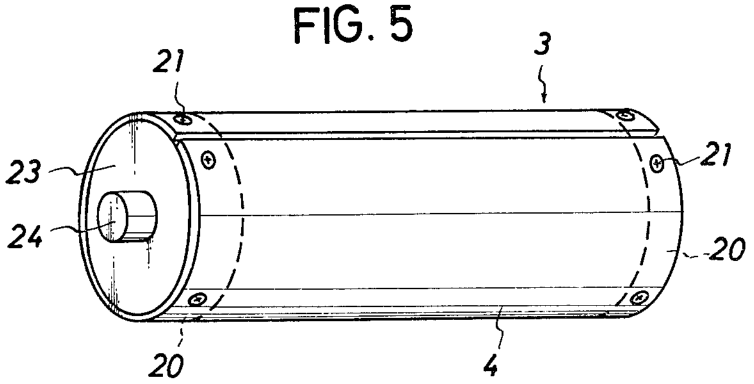
FIG. 5 is a perspective view of the heating drum equipped with the heating drum all over the circumference thereof.

FIG. 5 shows another embodiment of the heating drum 3, wherein the supporting shaft 24 projecting from the side plate 23 is rotatably supported to the frame member (not shown) so that the printing paper passes through on the outer circumference in close contact therewith, whereas the heating plate 4 is secured by the setscrew 21 to the flange 20 of the drum so that it will cover the whole surface of the circumference.

Figure 6:
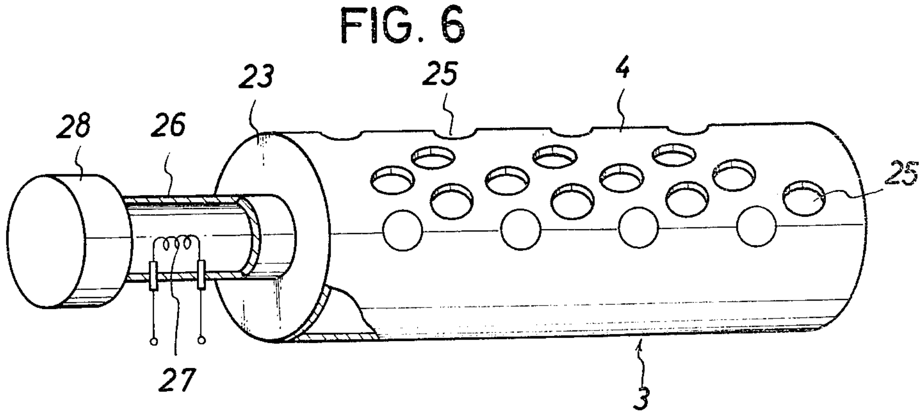
FIG. 6 is a partial cross-sectional view of the heating drum equipped with an aperture for blowing the hot air around the half of the circumference thereof.

FIG. 6 is another embodiment of the heating drum 3, wherein plural aperture 25 are provided over half of the outer circumference of the brass made drum to form the heating plate 4, the heater 27 may be built in the brass made blast pipe 26 mounted on the side plate 23 on one side, hot air is supplied in the drum by means of the air blower 28 mounted on the edge of the blast pipe 26 and the hot air is blown from the apertures 25 so that the printing paper 1 which passes through on the heating plate may be dried.

Incidentally, description of the aforesaid U.S. Pat. No. 3,673,598 can be applied to an electrostatic image forming apparatus 6 and the aforesaid U.S. Pat. No. 3,220,833 to a developer 8 and a fixing apparatus 9.

Next the operation will be explained with reference to the construction shown in FIG. 1. The printing paper 1 is continuously fed when the driving rollers 11 and 12 are rotated in the direction of the arrow mark by a motor, etc, (not shown). Electrostatic images of characters, numerals, symbols, etc, are formed, as the printing paper 1 has adhered thereto loaded grains 7 which are selectively controlled by the aperture board 6 over its surface after being dried by the heating plate 4 of the heating drum 3. This electrostatic image can be maintained for sufficient time by increasing the electric resistance by drying the printing paper 1. Accordingly, clear visible figure of characters, numerals, symbols, etc, are formed thereafter on the printing paper 1 by making visible dust figures with the developer 8 and furthermore by heat fusing with the fixing apparatus.

As mentioned above in details, this invention avoids the sensitive plate which is easily damaged, deteriorated and difficult in maintenance, because this invention allows electrostatic images to be formed with loaded grains adhered on the printing paper only after increasing the electric resistance by drying the printing paper in advance and then they are developed and fixed. Furthermore, there are many advantages in economy, since cheap ordinary paper can be used in printing.

What is claimed is:

1. A high speed printer for obtaining visual images of figures on paper by developing and fixing electrostatic images or figures of characters, numerals, symbols, etc. after forming them, comprising in order, means for drying said paper prior to forming an image thereon, means for forming an electrostatic image on said paper, means for depositing visible grains on said electrostatic image for development thereof, and means for fixing said visible grains to said paper, said drying means comprising a heating drum formed of a semi-cylindrical heating plate including a heater for drying the paper and a semi-cylindrical non-heating part, said semi-cylindrical heating plate mating with said semi-cylindrical non-heating part to form said heating drum.

2. The invention as set forth in claim 1, wherein said semi-cylindrical heating plate comprises a heating coil embedded in a mica material and an external cover enclosing said coil and said mica.

3. The invention as set forth in claim 1, wherein said heating drum is formed of side circular flanges upon which said semi-cylindrical heating and non-heating parts are mounted to form a cylindrical structure.

4. The invention as set forth in claim 2, wherein said heating drum is formed of said circular flanges upon which said semi-cylindrical heating and non-heating parts are mounted to form a cylindrical structure.

* * * * *